(12) United States Patent
Rattan

(10) Patent No.: US 10,917,100 B2
(45) Date of Patent: Feb. 9, 2021

(54) COMPARATOR CIRCUITRY

(71) Applicant: SOCIONEXT INC., Kanagawa (JP)

(72) Inventor: Suhas Rattan, Reading (GB)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/719,801

(22) Filed: Dec. 18, 2019

(65) Prior Publication Data

US 2020/0204184 A1 Jun. 25, 2020

(30) Foreign Application Priority Data

Dec. 19, 2018 (EP) .................................. 18214275

(51) Int. Cl.
*H03M 1/10* (2006.01)
*H03M 1/06* (2006.01)
(Continued)

(52) U.S. Cl.
CPC ......... *H03M 1/0609* (2013.01); *H03M 1/002* (2013.01); *H03M 1/38* (2013.01);
(Continued)

(58) Field of Classification Search
CPC ...... H03M 1/002; H03M 1/0836; H03M 1/00; H03M 1/08; H03M 1/0863; H03M 1/56;
(Continued)

(56) References Cited

U.S. PATENT DOCUMENTS 5,245,223 A 9/1993 Lim et al.
5,541,538 A 7/1996 Bacrania et al.
(Continued)

FOREIGN PATENT DOCUMENTS

CN 102545848 B 8/2015
EP 2211468 A1 7/2010

OTHER PUBLICATIONS

Extended European Search Report issued in corresponding European Patent Application No. 18214275.2, dated Jun. 19, 2019.

*Primary Examiner* — Linh V Nguyen
(74) *Attorney, Agent, or Firm* — McDermott Will & Emery LLP

(57) ABSTRACT

Comparator circuitry for use in a comparator to capture differences between magnitudes of a pair of comparator input signals in a series of capture operations defined by a reset signal, the circuitry comprising: latch circuitry, comprising a pair of latch input transistors which form corresponding parts of first and second current paths of the latch circuitry respectively, which current paths extend in parallel between high and low voltage sources, a pair of latch output nodes at corresponding positions along the first and second current paths of the latch circuitry respectively, and timing circuitry; and gain-stage circuitry, comprising a pair of cross-coupled gain-stage output transistors connected along respective first and second current paths of the gain-stage circuitry which extend in parallel between high and low voltage sources, and a pair of diode-connected gain-stage output transistors connected in parallel with the pair of cross-coupled gain-stage output transistors, respectively.

16 Claims, 8 Drawing Sheets

FIRST GAIN STAGE | SECOND GAIN STAGE | LATCH STAGE

(51) Int. Cl.
*H03M 1/00* (2006.01)
*H03M 1/38* (2006.01)
*H02M 3/07* (2006.01)
*H03K 3/013* (2006.01)
*H03K 5/24* (2006.01)

(52) U.S. Cl.
CPC ............... *H02M 3/07* (2013.01); *H03K 3/013* (2013.01); *H03K 5/249* (2013.01); *H03K 5/2481* (2013.01)

(58) Field of Classification Search
CPC ...... H03K 5/249; H03K 3/037; H03K 5/2481; H03K 3/356034; H03K 3/35613; H03K 3/356139; H03K 5/2445
USPC .......................................... 341/134–137, 155
See application file for complete search history.

(56) References Cited

U.S. PATENT DOCUMENTS

| | | | |
|---|---|---|---|
| 6,392,449 B1 | 5/2002 | Taft | |
| 7,124,221 B1* | 10/2006 | Zerbe | H04L 25/03006 710/106 |
| 8,188,768 B2* | 5/2012 | Bae | H03K 3/356139 327/53 |
| 8,248,108 B2* | 8/2012 | Santoro | H03K 5/2481 327/63 |
| 8,692,582 B1 | 4/2014 | Atesoglu et al. | |
| 9,455,695 B2* | 9/2016 | Kull | H03K 5/249 |
| 10,505,519 B1* | 12/2019 | Chen | H03K 3/0233 |
| 2004/0108879 A1* | 6/2004 | Choi | A61B 17/068 327/215 |
| 2007/0120581 A1 | 5/2007 | Kim | |
| 2009/0179787 A1* | 7/2009 | Naka | H03M 1/0607 341/155 |
| 2014/0132307 A1* | 5/2014 | Chan | H03K 5/22 327/64 |
| 2018/0026618 A1* | 1/2018 | Nicollini | H03K 5/2481 327/50 |

\* cited by examiner

COMPARATOR CIRCUITRY

CROSS-REFERENCE TO RELATED APPLICATION

The present application claims priority under 35 U.S.C. § 119 to European Patent Application No. 18214275.2 filed on Dec. 19, 2018. The above application is hereby expressly incorporated by reference, in its entirety, into the present application.

The present invention relates to comparator circuitry useful for capturing a difference between two input signals, for example a difference between their magnitudes. Such magnitudes may be voltage levels in the case of input voltage signals for example. Such circuitry may be useful in comparators.

Comparators typically compare two voltages or currents and output a signal indicating which one of the two is the larger (or the smaller). Comparators, in particular clocked comparators, are typically used in ADC (analogue-to-digital converter) and memory circuitry.

For example, a successive approximation register (SAR) ADC typically uses a comparator in each of its sub-conversion operations. Successive-approximation conversion may be considered as one example of a conversion process which is made up of a sequence of sub-conversion operations. Such ADC circuitry (mixed-signal circuitry) may have particular use, for example, as the ADC circuitry (sub-ADC units) used at the ends of the paths in the sampling circuitry disclosed in EP-A1-2211468.

It will be appreciated that the application of comparators (and circuitry thereof) in such ADC circuitry is merely one example application, and that the circuitry disclosed herein may be applied in comparators in general or indeed in circuitry for capturing or measuring or amplifying a magnitude difference between two input signals in general, and for example capturing which of those signals has the larger (or smaller) magnitude.

As background, therefore, to explore one potential application of circuitry of the present invention in ADC circuitry, aspects of the sampling circuitry disclosed in EP-A1-2211468 will now be considered.

FIG. 1 is a schematic diagram of analogue-to-digital circuitry 40, to which the present invention may be applied. Circuitry 40 comprises sampler 42, voltage-controlled oscillator (VCO) 44 as an example clock-signal generator, demultiplexers 46, ADC banks 48, digital unit 50 and calibration unit 52.

The sampler 42 is configured to perform four-way or four-phase time-interleaving so as to split the input current $I_{IN}$ by current steering into four time-interleaved sample streams A to D. For this purpose, VCO 44 is a quadrature VCO operable to output four clock signals 90° out of phase with one another, for example as four raised cosine signals. VCO 44 may for example be a shared 16 GHz quadrature VCO to enable circuitry 40 to have an overall sample rate of 64 GS/s.

Each of streams A to D comprises a demultiplexer 46 and an ADC bank 48 connected together in series as shown in FIG. 1. The sampler 42 operates in the current mode and, accordingly, streams A to D are effectively four time-interleaved streams of current pulses originating from (and together making up) input current $I_{IN}$, each stream having a sample rate one quarter of the overall sample rate. Continuing the example overall sample rate of 64 GS/s, each of the streams A to D may have a 16 GS/s sample rate.

Focusing on stream A by way of example, the stream of current pulses is first demultiplexed by an n-way demultiplexer 46. Demultiplexer 46 is a current-steering demultiplexer and this performs a similar function to sampler 42, splitting stream A into n time-interleaved streams.

The n streams output from demultiplexer 46 pass into ADC bank 48, which contains n ADC sub-units each operable to convert its incoming pulse stream into digital signals, for example into 8-bit digital values. Accordingly, n digital streams pass from ADC bank 48 to digital unit 50.

Streams B, C, and D operate analogously to stream A, and accordingly duplicate description is omitted. If n=80, circuitry 40 may be considered to comprise 320 ADC sub-units split between the four ADC banks 48.

Calibration unit 52 is connected to receive a signal or signals from the digital unit 50 and, based on that signal, to determine control signals to be applied to one or more of the sampler 42, VCO 44, demultiplexers 46 and ADC banks 48.

FIG. 2 is a schematic diagram useful for understanding the principle of operation of ADC banks 48. For simplicity, only one output 60 of the demultiplexers 46 is shown, and consequently the ADC circuitry 48 shown represents only the ADC circuitry (sub-ADC unit) required for that particular output. Similar ADC circuitry 48 (sub-ADC units) may be provided for all the outputs of the demultiplexers 46.

ADC circuitry 48 generally takes the form of a capacitance 150. As shown in FIG. 2, capacitance 150 may be variable in value, such that its value can be trimmed during calibration or during an initial setup phase. Generally speaking, capacitance 150 is employed to convert the current pulses from output 60 into voltage values $V_{OUT}$. That is, each pulse charges up capacitance 150 to a voltage proportional to the area of the pulse concerned. This is because the amount of charge in each current pulse is defined by its area ($Q=\int I\,dt$), and because the voltage across the capacitance 150 is defined by that amount of charge Q and the capacitance value C ($V=Q/C$).

The voltage $V_{OUT}$ for a particular pulse is held across capacitance 150 until the circuitry 48 is reset by reset switch 152. Whilst the voltage $V_{OUT}$ for a particular pulse is held, this analog output value can be converted into a digital output value, for example using an ADC circuit employing a successive-approximation register (SAR). In the case of differential circuitry, as may be the case for the FIG. 1 circuitry although not explicitly shown, each $V_{OUT}$ will have its complementary $V_{OUT}$, and the pair may be applied together to a differential comparator so that a single digital output for that pair is output.

An advantage of this mode of operation is that even if delays are experienced within the demultiplexers 46, the charge in each pulse will still make it to the relevant outputs, albeit over a slightly longer period. In that case, the voltage $V_{OUT}$ produced from the pulse remains unaffected. To illustrate this point, two examples 154 and 156 of the same current pulse are shown in FIG. 2. The first pulse 154 represents a case in which minimal delay is experienced. The second pulse 156 represents a case in which some delay/spreading is experienced, for example due to track capacitance in the circuitry.

Consequently, pulse 156 is stretched in time as compared to pulse 154. Importantly, the area of the two pulses 154 and 156 is substantially the same, and thus the output voltage $V_{OUT}$ would be the same for both.

FIG. 3 is a schematic diagram useful for understanding a possible application of SAR—ADC (Successive Approximation Register—Analogue-to-Digital Conversion) circuitry within each sub-ADC unit of the circuitry 48 in FIG.

1. Such circuitry could have a cycle of sub-conversion operations (phases/steps) of the form: Reset (R); Sample (S); 1; 2; 3; 4; 5; 6; 7 and 8, as shown in FIG. 3 as an example. In each Sample sub-conversion operation, a current pulse concerned may be converted into an output voltage $V_{OUT}$, and subsequently that voltage $V_{OUT}$ may be turned into an 8-bit digital value over the following 8 SAR sub-conversion operations. The next Reset sub-conversion operation then prepares the circuitry for the next current pulse.

FIG. 4 presents example SAR ADC circuitry which may be employed with the circuitry of FIGS. 1 and 2, i.e. as part of the sub-ADC units of the ADC banks 48. The main elements are a S/H circuit 170 to acquire $V_{OUT}$ from FIG. 2, a voltage comparator 180, an internal DAC 190 and an SAR 200. The comparator 180 compares the held $V_{OUT}$ with the output of the internal DAC 190 and outputs the result of the comparison to the SAR 200. The SAR 200 is designed to supply a digital code approximating $V_{OUT}$ to the internal DAC 190. The DAC 190 supplies the comparator 180 with an analogue voltage based upon the digital code input from the SAR 200.

In the present example, the SAR 200 is initialised so that its MSB is equal to digital 1 (the other bits being digital 0). This code is then input to DAC 190, whose output analogue voltage is supplied to comparator 180. If this analogue voltage is greater than $V_{OUT}$ the comparator 180 causes SAR 200 to reset this bit; otherwise, the bit is kept as a 1. Then, the next bit is set to 1 and the same procedure (sub-conversion operation) is followed, continuing this binary search until every bit in the SAR 200 has been tested (these "tests" corresponding respectively to sub-conversion operations 1 to 8 in FIG. 3). The resulting digital code output from the SAR 200 is the digital approximation of the sample voltage $V_{OUT}$ and is finally output when the conversion is complete.

It will be apparent that each such "test" involves a comparison operation performed by the comparator. Typically, such sub-conversion operations are carried out synchronously, i.e. with each sub-conversion operation taking the same amount of time as regulated by a clock signal. This may mean that each sub-conversion has a "compare" period during which the necessary comparison is carried out, and at the end of which the result of the comparison is delivered to the surrounding circuitry. This "compare" period may then be followed by a "reset" period in which the comparator is readied for the next comparison, i.e. the next sub-conversion operation. This places pressure on the comparator to consistently produce an accurate output within a given time period, even when its inputs may be very close in voltage level. The performance of the comparator affects the overall performance of the sub-ADC units and thus also of the overall analogue-to-digital circuitry 40 of FIG. 1.

Of course, the sub-conversion operations may instead be carried out asynchronously, i.e., with each individual successive sub-conversion operating being triggered by the preceding sub-conversion operation concluding. In that case the sub-conversion operations could be considered to be controlled by an asynchronous clock signal, but there may be pressure on the overall sequence of sub-conversion operations 1 to 8 completing with a given compare period which itself is synchronous with a synchronous clock signal. For example, in the context of the FIG. 1 circuitry, the Reset (R) and Sample (S) operations may occur synchronously, but with the operations 1; 2; 3; 4; 5; 6; 7 and 8 occurring asynchronously within the time available between successive Reset (R) and Sample (S) operations.

It is desirable to provide circuitry which enables fast low-power low-noise comparator circuitry to be implemented. It is desirable for such circuitry to have consistent performance (e.g. over varying process, voltage, etc.). Such circuitry may be for use in a comparator, or may be for use in other types of circuitry (for example in memories).

According to an embodiment of a first aspect of the present invention there is provided comparator circuitry for use in a comparator to capture differences between magnitudes of a pair of comparator input signals in a series of capture operations defined by a reset signal, the circuitry comprising: latch circuitry, comprising a pair of latch input transistors which form corresponding parts of first and second current paths of the latch circuitry respectively, which current paths extend in parallel between high and low voltage sources, a pair of latch output nodes at corresponding positions along the first and second current paths of the latch circuitry respectively, and timing circuitry; and gain-stage circuitry, comprising a pair of cross-coupled gain-stage output transistors connected along respective first and second current paths of the gain-stage circuitry which extend in parallel between high and low voltage sources, and a pair of diode-connected gain-stage output transistors connected in parallel with the pair of cross-coupled gain-stage output transistors, respectively, wherein: the timing circuitry is configured to bring voltage levels at said latch output nodes to a reset state between successive capture operations based on the reset signal to control the timing of the series of capture operations; the gain-stage circuitry is configured, in the capture operations, to control currents flowing through the pairs of gain-stage output transistors based on the first and second comparator input signals whereby a difference between currents flowing through the pair of diode-connected gain-stage output transistors is dependent upon a difference between the pair of comparator input signals; the pair of diode-connected gain-stage output transistors are connected to the pair of latch input transistors respectively in respective current-mirror arrangements whereby currents flowing through the latch input transistors in the capture operations are related to the currents flowing through the diode-connected gain-stage output transistors respectively due to current mirroring; and the latch circuitry is configured, in the capture operations, to generate a latch output signal at the latch output nodes indicative of a difference between the comparator input signals based on a difference between the currents flowing through the latch input transistors.

The latch input transistors may form corresponding parts of the first and second current paths in that current flowing along those paths flows through those transistors. For example, the channels of the latch input transistors may form corresponding parts of the first and second current paths where they are field-effect transistors. Similarly, the cross-coupled gain-stage output transistors may be connected along the respective first and second current paths of the gain-stage circuitry in that current flowing along those paths flows through those transistors. For example, the channels of those transistors may form corresponding parts of those paths where they are field-effect transistors. Similar considerations apply to the other transistors herein which are connected along current paths.

The output transistors (cross-coupled gain-stage output transistors and diode-connected gain-stage output transistors) may be referred to as load transistors, in that they form loads of the gain stage circuitry.

The reset signal may be a synchronous or asynchronous clock signal, and the comparator circuitry may be considered dynamic comparator circuitry. The various pair of transistors may be considered matched or differential pairs. Indeed, the comparator circuitry may be considered differential, or differential-input circuitry.

The current-mirror arrangements enable currents flowing through the latch input transistors in the capture operations to be related to the currents flowing through the diode-connected gain-stage output transistors respectively due to current mirroring. It will be appreciated from the detailed description later herein that this current mode operation has notable advantages over voltage mode operation.

The latch circuitry may comprise a pair of cross-coupled latch output transistors which form parts of the first and second current paths of the latch circuitry respectively between the latch output nodes and one of the high and low voltage sources, the pair of latch input transistors forming parts of the first and second current paths of the latch circuitry respectively between the latch output nodes and the other one of the high and low voltage sources.

As before, the cross-coupled latch output transistors may form parts of the first and second current paths of the latch circuitry respectively in that current flowing along those paths flows through those transistors. For example, the channels of the cross-coupled latch output transistors may form corresponding parts of the first and second current paths of the latch circuitry where they are field-effect transistors. Similarly, the channels of the pair of latch input transistors may form parts of the first and second current paths of the latch circuitry respectively between the latch output nodes and the other one of the high and low voltage sources where they are field-effect transistors.

The output transistors (cross-coupled latch output transistors) may be referred to as load transistors, in that they form loads of the latch circuitry.

The latch circuitry may comprise a pair of intermediate nodes at corresponding positions along the first and second current paths of the latch circuitry respectively, which positions are between the latch output nodes and the latch input transistors. The pair of cross-coupled latch output transistors may be a first pair of cross-coupled latch output transistors. The latch circuitry may comprise a second pair of cross-coupled latch output transistors which form parts of the first and second current paths of the latch circuitry respectively between the latch output nodes and the intermediate nodes.

As before, the second pair of cross-coupled latch output transistors may form parts of the first and second current paths of the latch circuitry respectively in that current flowing along those paths flows through those transistors. For example, the channels of the second pair of cross-coupled latch output transistors may form corresponding parts of the first and second current paths of the latch circuitry where they are field-effect transistors.

The first pair of cross-coupled latch output transistors may be of opposite channel type to the second pair of cross-coupled latch output transistors, for example forming a pair of inverters. For each of the first and second current paths of the latch circuitry, the drain terminals of the cross-coupled latch output transistors concerned may be connected together at the latch output node of that current path. The drain terminals of the latch input transistors may from the intermediate nodes of the latch circuitry.

The source terminals of the latch input transistors may form the ends of their respective current paths at the one of the high and low voltage sources concerned, or may be connected to the one of the high and low voltage sources concerned via non-switched current paths.

The timing circuitry may comprise at least one switch configured to conductively connect the latch output nodes to one another and/or to a common voltage source based on the reset signal to bring voltage levels at said latch output nodes to the reset state between successive capture operations.

The source terminals of the cross-coupled gain-stage output transistors, and/or of the diode-connected gain-stage output transistors, may form the ends of their respective current paths at the one of the high and low voltage sources concerned, or may be connected to the one of the high and low voltage sources concerned via non-switched current paths.

The gain-stage circuitry may comprise: a current source configured to provide a bias current which flows independently of the reset signal; a tail node at which the first and second current paths of the gain-stage circuitry meet to form a single current path along which the current source is provided, the tail node connected to receive the bias current; a pair of intermediate nodes conductively connectable to said tail node along the first and second current paths of the gain-stage circuitry respectively, those intermediate nodes located along the first and second paths of the gain-stage circuitry between the cross-coupled gain-stage output transistors and the tail node; and a pair of gain-stage input transistors connected along the first and second current paths of the gain-stage circuitry respectively, between the intermediate nodes of the gain-stage circuitry and the tail node, and configured to be controlled based on the pair of comparator input signals, respectively, such that the conductivity of the connections between the tail node and the pair of intermediate nodes is controlled by the magnitudes of the first and second comparator input signals. The bias current may be a non-switched, constant or DC bias current.

The gain-stage circuitry may comprise a pair of intermediate transistors connected along the first and second current paths of the gain-stage circuitry respectively, between the intermediate nodes of the gain-stage circuitry and the cross-coupled gain-stage output transistors.

As before, the pair of intermediate transistors may form parts of the first and second current paths of the gain-stage circuitry respectively in that current flowing along those paths flows through those transistors. For example, the channels of the pair of intermediate transistors may form corresponding parts of the first and second current paths of the gain-stage circuitry where they are field-effect transistors.

The intermediate transistors may be controlled by a bias signal which is independent of the reset signal. For example, each bias signal may be a non-switched, constant or DC bias signal. For example, the bias signals may be configured to cause the intermediate transistors to function as cascode transistors.

The drain terminals of the cross-coupled gain-stage output transistors may form output nodes of the gain-stage circuitry and may be connected to control the latch input transistors respectively.

The gain-stage circuitry may comprise timing circuitry configured to bring voltage levels at the drain terminals of the cross-coupled gain-stage output transistors to a reset state between successive capture operations based on the reset signal. That timing circuitry may comprise at least one switch configured to conductively connect the drain terminals of the cross-coupled gain-stage output transistors to one another based on the reset signal.

The gain-stage circuitry described above may be second-gain-stage circuitry and the comparator circuitry may comprise first-gain-stage circuitry. The first-gain-stage circuitry may have a pair of input transistors configured to be controlled by the pair of comparator input signals and to control output signals at respective output nodes of the first-gain-stage circuitry. The output nodes of the first-gain-stage circuitry may be connected to the pair of input transistors of the second-gain-stage circuitry respectively to control those input transistors of the second-gain-stage circuitry respectively.

In more detail, the first-gain-stage circuitry may comprise: first and second current paths which extend in parallel between high and low voltage sources; a current source configured to provide a bias current which flows independently of the reset signal; a tail node at which the first and second current paths of the first-gain-stage circuitry meet to form a single current path along which the current source of the first-gain-stage circuitry is provided, that tail node connected to receive that bias current; a pair of intermediate nodes conductively connectable to the tail node of the first-gain-stage circuitry along the first and second current paths of the first-gain-stage circuitry respectively, those intermediate nodes located along the first and second current paths of the first-gain-stage circuitry between a pair of resistive loads located at corresponding positions long those current paths and that tail node; and a pair of input transistors connected along the first and second current paths of the first-gain-stage circuitry respectively, between the intermediate nodes and the tail node of the first-gain-stage circuitry, and configured to be controlled by the pair of comparator input signals, respectively, such that the conductivity of the connections between the tail node and the pair of intermediate nodes of the first-gain-stage circuitry is controlled by the magnitudes of the first and second comparator input signals, wherein drain terminals of the input transistors of the first-gain-stage circuitry form output nodes of the first-gain-stage circuitry which are connected to the pair of input transistors of the second-gain-stage circuitry respectively to control those input transistors of the second-gain-stage circuitry respectively.

The latch circuitry may be considered differential-input dynamic or clocked latch circuitry, with parts corresponding to parts of strongARM latch circuitry or buffered RS latch circuitry. The comparator input signals may be voltage-mode signals and the magnitudes may be voltage levels. The comparator input signals may be current-mode signals and the magnitudes may be values of current. The comparator input signals may be charge-mode signals and the magnitudes may be amounts of charge. The comparator input signals may be analogue signals.

According to an embodiment of a second aspect of the present invention there is provided a comparator comprising the comparator circuitry of the aforementioned first aspect of the present invention.

According to an embodiment of a third aspect of the present invention there is provided analogue-to-digital converter circuitry, comprising: an analogue input terminal, operable to receive an analogue input voltage signal; the comparator of the aforementioned second aspect of the present invention; and successive-approximation control circuitry configured to apply the comparator input signals to the comparator based upon the input voltage signal, and configured to control the comparator input signals for each of a series of successive approximation operations, the control applied in each successive approximation operation being dependent on a comparison result generated by the comparator in the preceding approximation operation.

According to an embodiment of a fourth aspect of the present invention there is provided analogue-to-digital converter circuitry, comprising the comparator circuitry of the aforementioned first aspect of the present invention or the comparator of the aforementioned second aspect of the present invention.

According to an embodiment of a fifth aspect of the present invention there is provided integrated circuitry, such as an IC chip, comprising comparator circuitry of the aforementioned first aspect of the present invention, or the comparator of the aforementioned second aspect of the present invention, or the analogue-to-digital converter circuitry of the aforementioned third of fourth aspect of the present invention.

The present invention extends to method aspects corresponding as appropriate to the apparatus (e.g. circuitry) aspects.

Reference will now be made, by way of example, to the accompanying drawings, of which:

FIG. 1, considered above, is a schematic diagram of previously-considered analogue-to-digital circuitry;

FIG. 2, considered above, is a schematic diagram useful for understanding the principle of operation of the ADC banks of FIG. 1;

FIG. 3, considered above, is a schematic diagram useful for understanding a possible application of SAR—ADC circuitry within each sub-ADC unit of the FIG. 1 circuitry;

FIG. 4, considered above, presents example SAR ADC circuitry which may be employed with the circuitry of FIGS. 1 and 2;

Figure 5:
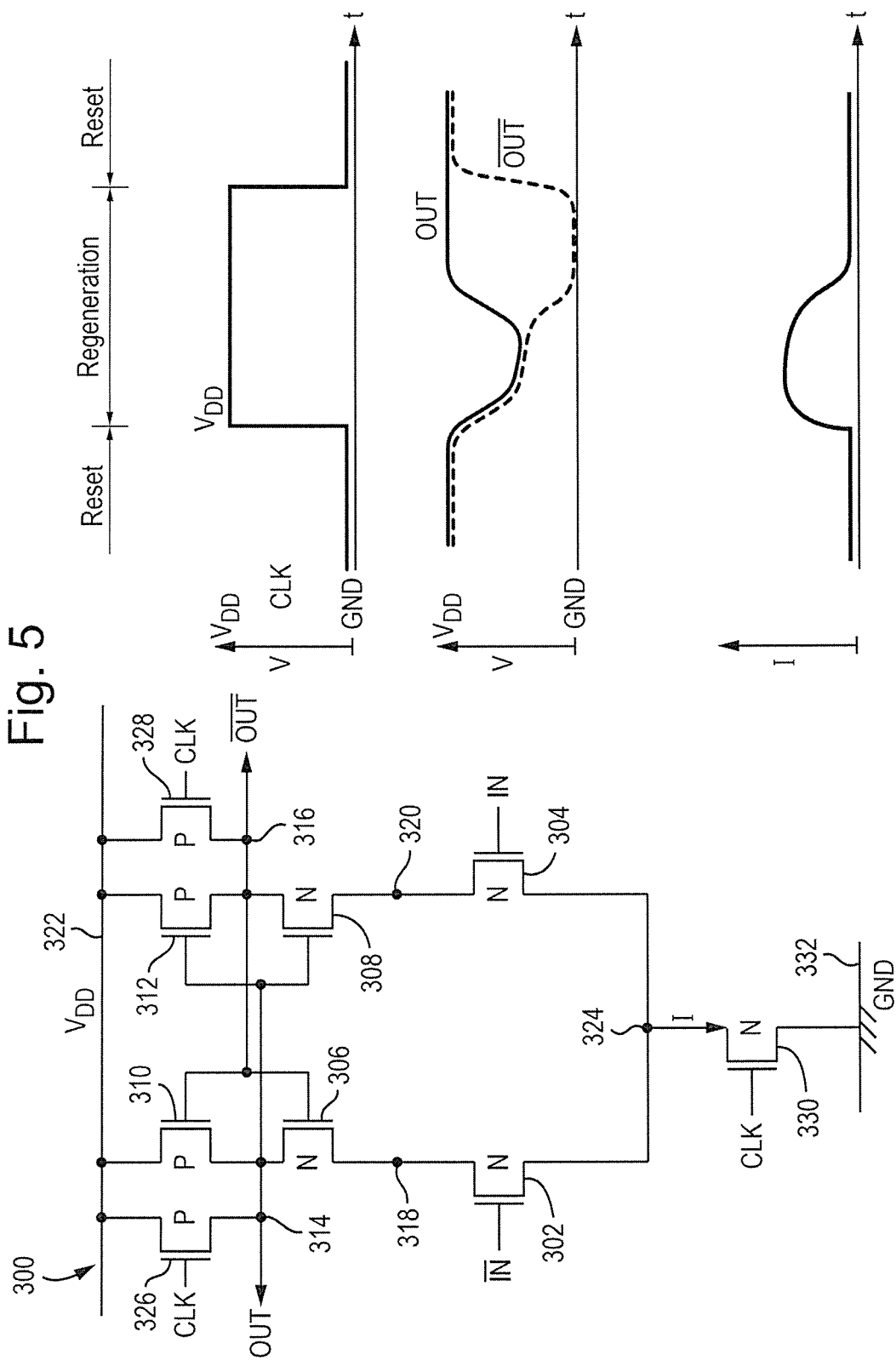
FIG. 5 is a schematic diagram of previously-considered example clocked comparator circuitry.

FIG. 5 is a schematic diagram of previously-considered example clocked comparator circuitry 300. Clocked comparator circuitry 300 may be referred to as latched comparator circuitry 300, and may be compared to latch circuitry known generically as a strongARM latch. The operation of the circuitry can be understood by the graphs provided alongside and commented on in more detail below.

Circuitry 300 comprises a differential pair of input transistors 302 and 304, two cross-coupled pairs of transistors 306, 308, 310 and 312, output nodes 314 and 316, intermediate nodes 318, 320, a first reference voltage source 322, a tail node 324, clocked precharge transistors 326 and 328, a clocked "compare" transistor 330 and a second reference voltage source 332, connected together as in FIG. 5.

More specifically, the differential pair of input transistors 302 and 304 are connected such that their gate terminals serve as a pair of differential inputs receiving input signals IN and /IN. These are the two comparator inputs to be compared to one another (see e.g. the two inputs to comparator 180 in FIG. 4).

The two cross-coupled pairs of transistors 306, 308, 310, 312 are coupled to form two cross-coupled inverters, with transistors 306 and 310 forming one of the inverters with its output connected to output node 314, and with transistors 308 and 312 forming the other one of the inverters with its output connected to output node 316. The inverter formed by transistors 306 and 310 is connected between the intermediate node 318 and the first reference voltage source 322, in this case VDD. The inverter formed by transistors 308 and 312 is connected between the intermediate node 320 and the first reference voltage source 322. The outputs of the inverters provide the outputs, at output nodes 314 and 316, of the comparator circuitry 300.

The differential pair of input transistors 302 and 304 are connected respectively between the intermediate nodes 318 and 320 and the common tail node 324.

The precharge (or reset) transistors 326 and 328 are respectively connected between the output nodes 314 and 316 and the first reference voltage source 322. The compare (or regeneration) transistor 330 is connected between the common tail node 324 and the second reference voltage source 332, in this case ground (GND). The precharge transistors 326 and 328 and the compare transistor 330 are connected to receive a clock signal CLK, in this case a switched logic level (e.g. square wave) signal alternating between logic high (VDD) and logic low (GND), as indicated in the relevant graph.

The transistors 302, 304, 306, 308 and 330 are NMOS MOSFETs, and the transistors 310, 312, 326 and 328 are PMOS MOSFETs.

In operation, the circuitry operates in alternating "reset" (when clock signal CLK is low) and "regeneration" (when clock signal CLK is high) phases in synchronisation with the clock signal CLK, as will be appreciated from the graphs in FIG. 5. Regeneration phases may be referred to as "compare" or, particularly in the light of circuitry disclosed later herein, as "capture" phases or operations.

In the "reset" phase when the clock signal CLK is low, the precharge transistors 326 and 328 are ON and pull the output nodes 314 and 316 to logic high or VDD. At this time, the compare transistor 330 is OFF, preventing current from flowing through e.g. the intermediate nodes 318 and 320.

As soon as the clock signal CLK goes high for the regeneration phase, the precharge transistors 326 and 328 turn OFF and the compare transistor 330 turns ON. Importantly, the input transistors 302 and 304 are also ON to a differing degree if their input signals (the comparator inputs) are slightly different from one another, as they inevitably would be (if only slightly).

The voltage levels at output nodes 314 and 316 fall as the current begins to flow, but because the transistors 302 and 304 are inevitably ON to differing degrees (in practice they will not be on to exactly the same degree) the differing currents flowing through the intermediate nodes 318 and 320 cause one of these voltages to drop (perhaps only slightly) faster than the other. The cross-coupled inverters serve to accelerate and amplify this difference (in the sense of increasing the difference, at an increasing rate) causing the voltage level at one of the output nodes to drop to logic low or ground (GND) and the voltage level at the other output node to rise again to logic high or VDD. This operation, and the associated flow of current through common tail node 324, can be appreciated from the graphs in FIG. 5.

Which of the output nodes 314 and 316 goes to logic high and which goes to logic low depends on (in the ideal case, in the absence of e.g. noise) which of the input signals IN and /IN is larger, so that the voltage levels of the output signals OUT and /OUT provide the comparison result at the end of that regeneration phase. The accuracy of the circuitry 300 is therefore dependent on the correct "decision" being taken when the voltage levels at the output nodes 314 and 316 diverge under acceleration of the cross-coupled inverters.

Of course, when the next "reset" phase starts i.e. when the clock signal CLK goes low, the precharge transistors 326 and 328 turn back ON and the compare transistor 330 turns back OFF, stopping the flow of current (such that there is no static current) and precharging the output nodes 314 and 316 to logic high or VDD again.

It will therefore be appreciated that the clocked comparator circuitry 300 serves to perform a comparison operation per clock cycle, in particular during each regeneration phase when the clock signal CLK is high, the comparison operation comparing the voltage levels of the input signals IN and /IN at that time and giving output signals OUT and /OUT which are either logic high and logic low or vice versa depending (ideally) on which of the input signals IN and /IN has the higher voltage level.

As explained above, this action is dominated by the cross-coupled inverters in the upper half of the circuitry 300. Based on the difference between the input signals IN and /IN, one of the inverters will start pulling in a particular direction slightly quicker than the other because of the difference between the currents which initially flow through the transistors 302 and 304 at the input. This will cause the two inverters to accelerate/amplify the difference between the two sides, with their outputs rapidly diverging. Like CMOS inverter circuitry the supply current only flows while the circuitry is active (transistor 330 is clocked).

Figure 6:
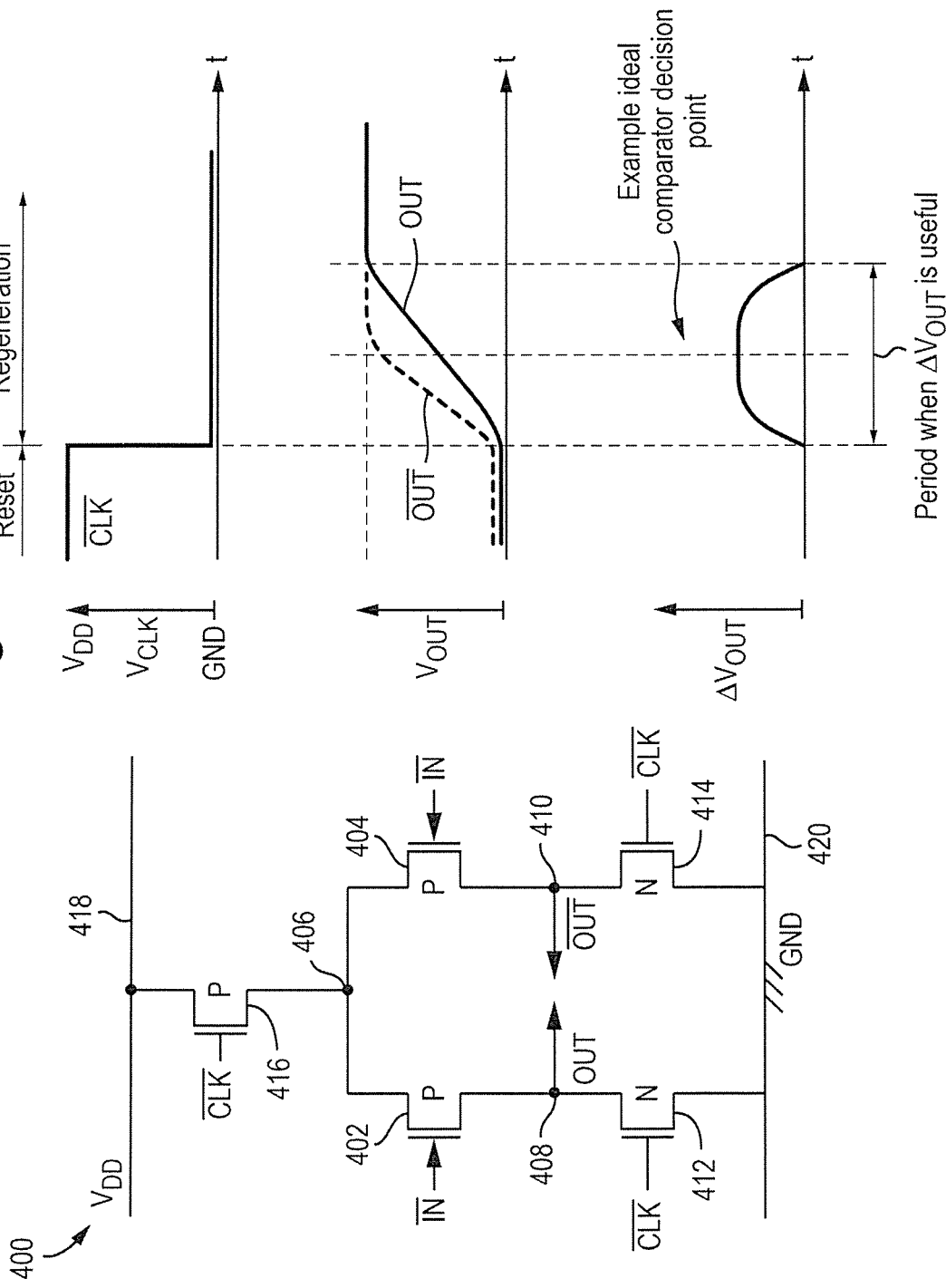
FIG. 6 is a schematic diagram of previously-considered example clocked pre-amplifier circuitry, for use with the FIG. 5 circuitry.

FIG. 6 is a schematic diagram of previously-considered example clocked pre-amplifier circuitry 400, for use with the clocked comparator circuitry 300. The operation of this circuitry 400 can be understood from the graphs provided alongside and commented on in more detail below, as for circuitry 300.

Circuitry 400 comprises a differential pair of input transistors 402 and 404, a common tail node 406, intermediate nodes 408 and 410, clocked transistors 412, 414 and 416, a first reference voltage source 418 and a second reference voltage source 420, connected together as in FIG. 6.

More specifically, the differential pair of input transistors 402 and 404 are connected such that their gate terminals serve as a pair of differential inputs receiving input signals IN and /IN. As before, these are the two comparator inputs to be compared with one another (see e.g. the two inputs to comparator 180 in FIG. 4). However, the clocked pre-amplifier circuitry 400 is for use with the clocked comparator circuitry 300 such that the output signals OUT and /OUT of the circuitry 400 (mentioned below) become the input signals IN and /IN in circuitry 300.

The input transistors 402 and 404 are connected between the common tail node 406 and the intermediate nodes 408 and 410, respectively. The clocked transistors 412 and 414 are respectively connected between the intermediate nodes 408 and 410 and the second reference voltage source 420, in this case ground (GND). The clocked transistor 416 is connected between the common tail node 406 and the first reference voltage source 418, in this case VDD. The ground and VDD levels between circuitry 300 and 400 may be the same but this is of course not essential.

The clocked transistors 412, 414 and 416 are connected to receive the clock signal/CLK, i.e. the inverse of the clock signal CLK in FIG. 5. Transistors 412 and 414 are NMOS MOSFETs and transistors 402, 404 and 416 are PMOS MOSFETs.

The intermediate nodes 408 and 410 provide the output signals OUT and /OUT to the transistors 304 and 302 in FIG. 5 as already mentioned.

In operation, the circuitry 400 operates based on the clock signal/CLK and thus for ease of comparison the "reset" and "regeneration" phases from FIG. 5 are shown for the graphs of FIG. 6.

In the "reset" phase, when the clock signal /CLK is high (and the clock signal CLK is low), the clocked transistors 412 and 414 are ON and the clocked transistor 416 is OFF. Thus, as with a CMOS inverter, the output signals OUT and /OUT at nodes 408 and 410 are at logic low or ground (GND). In the "regeneration" phase, when the clock signal/ CLK is low, the clocked transistors 412 and 414 are OFF and the clocked transistor 416 is ON. Thus, again in line with a CMOS inverter, the output signals OUT and /OUT at nodes 408 and 410 both rise up to logic high or VDD, given sufficient time (which is assumed here for ease of understanding).

The voltage levels of the input signals IN and /IN control the degree to which transistors 402 and 404 are ON, and during the regeneration phase this controls the current flowing through nodes 408 and 410 and consequently how quickly the voltage levels at those nodes rise up to logic high, i.e. up to the same voltage level. An example is shown in the $V_{OUT}$ graph in FIG. 6, with the output signal/OUT rising up to VDD quicker than the output signal OUT, and with there being a corresponding difference in voltage $\Delta V_{OUT}$ between these output signals OUT and /OUT for the short period of time indicated in the lower-most graph. An example ideal comparator decision point is indicated, i.e., where $V_{OUT}$ is largest, however it will be understood that the actual decision occurs under the operation of the circuitry 300 generally during the indicated period when $\Delta V_{OUT}$ is useful. It will be appreciated that the clocked pre-amplifier circuitry 400 can provide an amplified voltage difference $\Delta V_{OUT}$ at the input terminals (i.e. between input signals IN and /IN) of the circuitry 300 of FIG. 5, i.e. bigger than the voltage difference between the input signals IN and /IN of the circuitry 400 of FIG. 6 which would otherwise be provided directly to the circuitry 300 (i.e. in the absence of circuitry 400).

This amplification provides some noise performance benefit, which impacts the performance of the circuitry of FIGS. 5 and 6 in combination. However, the present inventor has identified ways to improve upon the performance of this combined circuitry.

Figure 7:
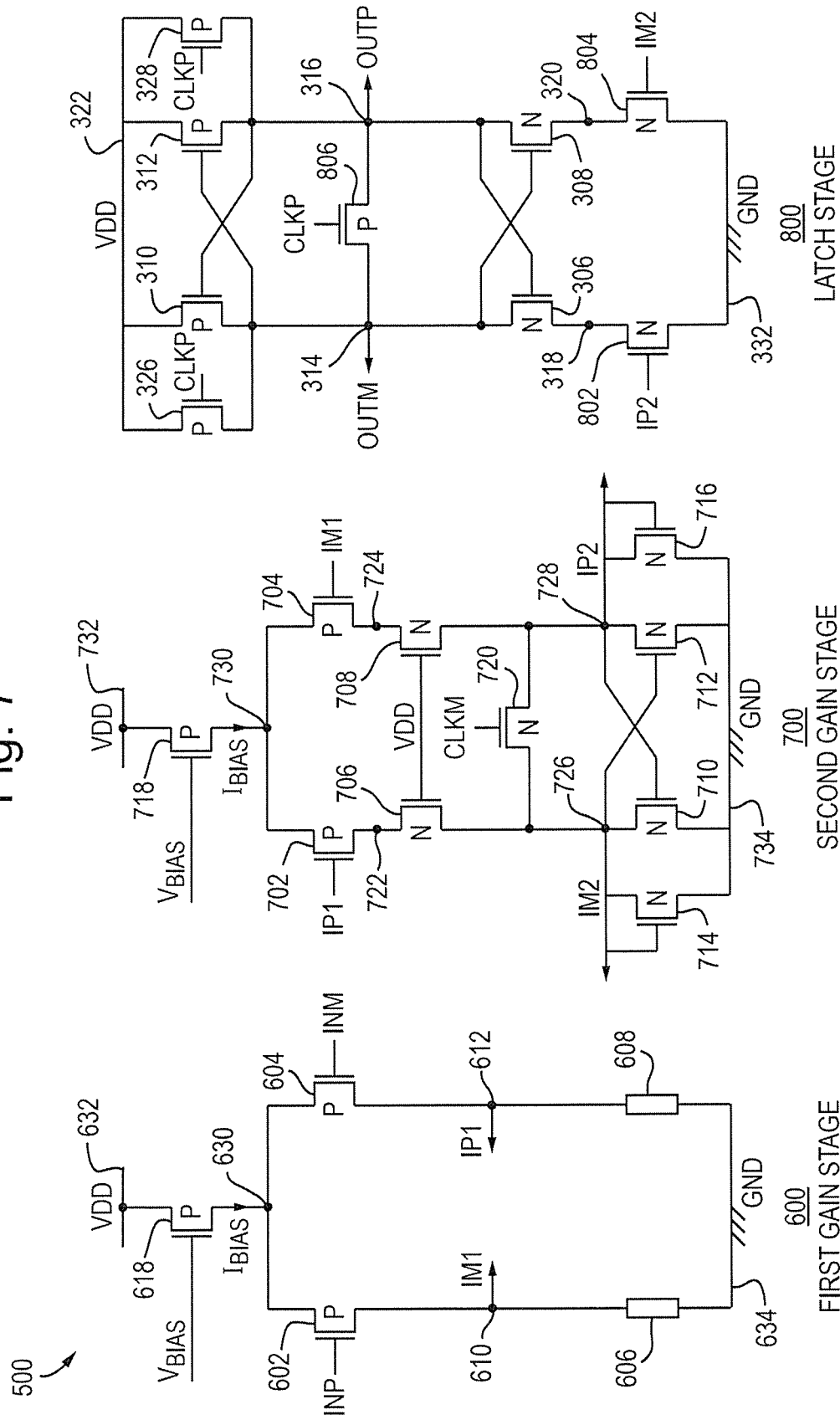
FIG. 7 is a schematic diagram of comparator circuitry embodying the present invention.
Figure 8:
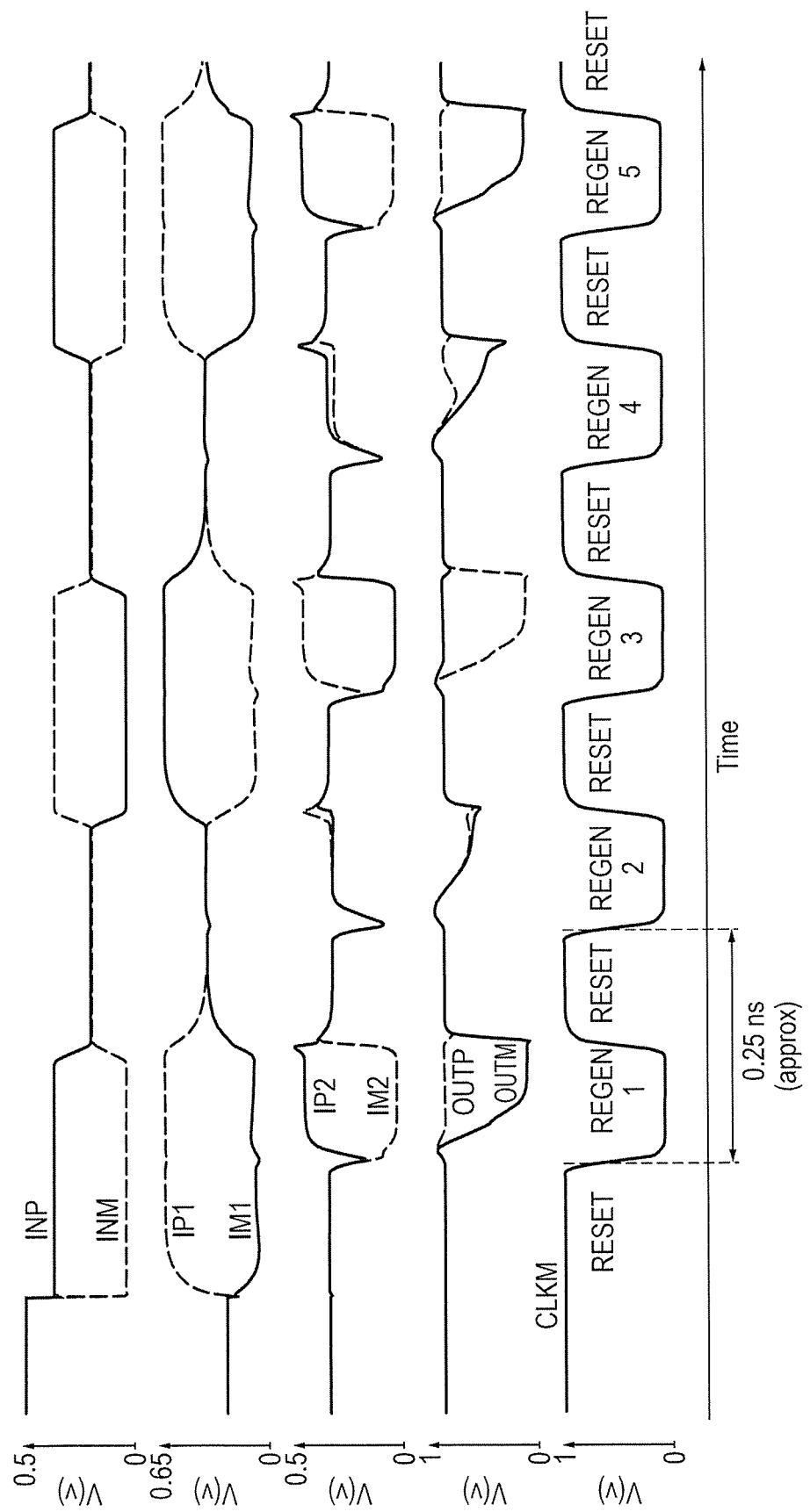
FIG. 8 is a schematic signal diagram, for understanding the operation of the FIG. 7 comparator circuitry.

FIG. 7 is a schematic diagram of comparator circuitry 500 embodying the present invention. Comparator circuitry 500 comprises a first gain stage 600, a second gain stage 700 and a latch stage 800. FIG. 8 is a schematic signal diagram, useful for understanding the operation of the comparator circuitry 500.

Each of the first gain stage 600, second gain stage 700 and latch stage 800 may itself embody the present invention, as may combinations of two of those stages (for example, the second gain stage 700 and latch stage 800). Each of the first gain stage 600, second gain stage 700 and latch stage 800 may be referred to as differential, or differential-input circuitry, as may the comparator circuitry 500 as a whole.

In overview, as can be seen from FIG. 7, the first gain stage 600 receives complementary (differential) input signals INP, INM and generates (applying gain) corresponding output signals IM1, IP1. The second gain stage 700 receives the complementary (differential) input signals IP1, IM1 and generates (applying gain) corresponding output signals IM2, IP2. The latch stage 800 receives the complementary (differential) input signals IP2, IM2 and generates (applying gain and latching) corresponding output signals OUTM, OUTP. In the present example, all of these signals are voltage signals.

Of course, although the input signals INP, INM are referred to as differential input signals, implying that both may vary, a single-ended input signal could be applied as one of those input signals with the other one being held (i.e. at a constant voltage level) to serve as a reference signal against which the single-ended input signal is compared.

For convenience of understanding, the latch stage 800 will be considered first, followed by the pre-amplifying second gain stage 700 and then the further pre-amplifying first gain stage 600.

The latch stage 800 is similar to the clocked comparator circuitry 300 of FIG. 5, except that the input transistors 302, 304 have been replaced with corresponding input transistors 802, 804, respectively, which are connected between the intermediate nodes 318, 320 and the second reference voltage source 332 (GND). Like elements have accordingly been denoted with like reference numerals to avoid duplicate description. In comparison to the FIG. 5 circuitry, the transistor 330 has effectively been omitted (or shorted) as if node 324 were connected (directly, or via a non-switched current path) to the second reference voltage source 332 (GND).

A clocked precharge transistor 806 is also provided, in addition to the clocked precharge transistors 326 and 328, to improve the precharging (or resetting) performance of the latch stage 800. The clocked precharge transistor 806 is connected between the output nodes 314 and 316. Of course, it will be apparent that not all of the precharge transistors 326, 328 and 806 need be provided to achieve the basic resetting effect at the output nodes 314 and 316; for example, any one of them could be omitted.

To avoid confusion with earlier Figures, the clock signals in FIG. 7 are labelled as CLKM and CLKP (where CLKP is 180 degrees out-of-phase with CLKM), rather than as CLK and /CLK. Such clock signals may be referred to as reset signals, and may be synchronous or asynchronous clock signals.

The clocked precharge transistors 326, 328 and 806 are connected to receive the clock signal CLKP, in this case a switched logic level (e.g. square wave) signal alternating between logic high (VDD) and logic low (GND), as indicated in the relevant (i.e. lowermost) graph in FIG. 8. Of course, although the clock signal CLKP is shown in FIG. 8 as being a synchronous clock signal for convenience, it may be an asynchronous clock signal as already mentioned above.

The transistors 802, 804, 306 and 308 are NMOS MOSFETs, and the transistors 310, 312, 326, 328 and 806 are PMOS MOSFETs. Of course the FIG. 7 circuitry could be implemented "the other way up", swapping NMOS MOSFETs for PMOS MOSFETS and vice versa. MOSFETs are of course one example type of FET (field-effect transistor), and thus these transistors may be described as field-effect transistors since other types of FET may be employed.

The transistors 310 and 312 may be considered cross-coupled in that the gate terminal of one is connected to the drain terminal of the other, and vice versa. The transistors 306 and 308 may be considered cross-coupled similarly in that the gate terminal of one is connected to the drain terminal of the other, and vice versa.

It will be appreciated that the latch stage 800 is structured in the form of parallel (complementary or differential) current paths, which extend between the first reference voltage source 322 (VDD) and the second reference voltage source 332 (GND). One such current path extends from VDD to GND via transistors 310, 306 and 802 in that order, and the other extends from VDD to GND via transistors 312, 308 and 804 in that order. Transistors 802 and 804 may thus be considered to be provided along those paths at corresponding (schematically the same) positions, as may be nodes 318 and 320, transistors 306 and 308, nodes 314 and 316, and transistors 310 and 312.

The general operation in terms of the cross-coupled inverters (transistors 306, 308, 310, 312, acting as loads) and the clocked transistors 326, 328, 806 will be understood from FIG. 5 described earlier. The circuitry 800 operates in alternating "reset" (when CLKM is high and CLKP is low) and "regeneration" (when CLKM is low and CLKP is high) phases in synchronisation with the clock signal, as will be appreciated from the graphs in FIG. 8. Regeneration phases may be referred to as "compare" or "capture" phases or operations. Five such regeneration phases are shown in FIG. 8, labelled REGEN 1 to REGEN 5, respectively.

In the "reset" phases when CLKP is low (CLKM is high), the precharge transistors 326, 328 and 806 are ON and pull the output nodes 314 and 316 to logic high or VDD, and also to the same voltage level as one another (particularly, due to the operation of the precharge transistor 806). This can be seen in FIG. 8. Unlike in FIG. 5, there is no compare transistor 330 preventing (transient) current from flowing through e.g. the intermediate nodes 318 and 320.

As soon as the clock signal CLKP goes high (CLKM goes low) for the "regeneration" phase, the precharge transistors 326, 328 and 806 turn OFF. Importantly, the input transistors 802 and 804 are also ON to a differing degree if their input signals (generated based on the comparator inputs) are slightly different from one another, as they inevitably would be (if only slightly). As there is no (clocked or switched) compare transistor 330, the input transistors 802, 804 may effectively be always ON and in the saturation mode, and the voltage swing at their gate terminals can be larger than for transistors 302, 304.

The voltage levels at output nodes 314 and 316 fall as the current begins to flow, but because the transistors 802 and 804 are inevitably ON to differing degrees (in practice they will not be ON to exactly the same degree) the differing currents flowing through the intermediate nodes 318 and 320 cause one of these voltages to drop (perhaps only slightly) faster than the other. The cross-coupled inverters serve to accelerate and amplify this difference (in the sense of increasing the difference, at an increasing rate), as can be appreciated from the graphs in FIG. 8.

Without explaining the first gain stage 600 and the second gain stage 700 in detail here, at this stage it is noted in connection with FIG. 8 that the input signals INP, INM to the first gain stage 600 (the overall comparator input signals) have been set up so that in each of the regeneration phases REGEN 1 and REGEN 5 the signal INP is clearly higher (in voltage) than INM, in each of the regeneration phases REGEN 2 and REGEN 4 the signal INP is only very slightly higher than INM, and in the regeneration phase REGEN 3 the signal INP is clearly lower than INM. Thus, it may be considered that the decision process of the comparator circuitry 500 is relatively "easy" in the regeneration phases REGEN 1, REGEN 3 and REGEN 5, and relatively "difficult" in the regeneration phases REGEN 2 and REGEN 4. As above, the first gain stage 600 and the second gain stage 700 apply gain to the input signals INP, INM to arrive at the input signals IP2, IM2 to the latch stage 800 as will be explained in more detail later.

Returning to FIG. 7, which of the output nodes 314 and 316 goes to or towards logic high and which goes to or towards logic low depends on (in the ideal case, in the absence of e.g. noise) which of the input signals IP2, IM2 is larger, so that the voltage levels of the output signals OUTM, OUTP provide the comparison result at the end of that regeneration phase. The accuracy of the circuitry 500 is therefore dependent on the correct "decision" being taken when the voltage levels at the output nodes 314 and 316 diverge under acceleration of the cross-coupled inverters.

Of course, when the next "reset" phase starts i.e. when the clock signal CLKP goes low (CLKM goes high), the precharge transistors 326, 328 and 806 turn back on, precharging the output nodes 314 and 316 to logic high or VDD (and to the same voltage level as one another) again. The presence of the precharge transistor 806 serves here to improve the balance between the two parallel current paths, i.e. the accuracy with which the output nodes 314 and 316 are brought to the same voltage level as one another.

It will therefore be appreciated that the latch stage 800 serves to perform a comparison operation per clock cycle, in particular during each regeneration phase when the clock signal CLKP is high (CLKM is low). The comparison operation compares the voltage levels of the input signals IP2, IM2 at that time and gives output signals OUTM, OUTP which are either (or have substantially approached) logic high and logic low or vice versa depending (ideally) on which of the input signals IP2, IM2 (and thus the input signals INP, INM, taking into account the gain stages 600, 700) has the higher voltage level.

As apparent from FIG. 8, the difference between OUTM and OUTP may quickly become very significant (corresponding to logic high and logic low) towards the end of the regeneration phases when the difference between the input signals IP2, IM2 (and thus the input signals INP, INM) is quite significant, as for example in regeneration phases REGEN 1, REGEN 3 and REGEN 5. This may be impacted by the timing, as in those cases the relative "ease" of the decision making has enabled the cross-coupled inverters (transistors 306, 308, 310, 312) to accelerate and amplify the difference between the input signals IP2, IM2 significantly in the time available.

The difference between OUTM and OUTP may however become significant less quickly, or even become less significant (but enough to deduce logic high and logic low outputs, perhaps with an additional SR latch or similar) towards the end of the regeneration phases when the difference between the input signals IP2, IM2 (and thus the input signals INP, INM) is less significant, as for example in regeneration phases REGEN 2 and REGEN 4. This may again be impacted by the timing, as in those cases the relative "difficulty" of the decision making has not enabled the cross-coupled inverters (transistors 306, 308, 310, 312) to accelerate and amplify the difference between the input signals IP2, IM2 so readily or so far in the time available.

It may be noted that the amplified difference between OUTP and OUTM towards the end of the regeneration phase REGEN 2 is less pronounced than for REGEN 4. This is due to the comparator circuitry 500 effectively turning on and reaching a stable operating state (e.g. the relevant transistors turning on and reaching their designed operating points) in time for REGEN 4 but not for REGEN 2.

The second gain stage 700 comprises a differential pair of input transistors 702 and 704, a pair of cascode transistors 706 and 708, a pair of cross-coupled output (load) transistors 710 and 712, a pair of diode-connected output (load) transistors 714 and 716, a current-source transistor 718, a clocked transistor 720, a pair of intermediate nodes 722 and 724, a pair of output nodes 726 and 728, a tail node 730, a first reference voltage source (VDD) 732 and a second reference voltage source (GND) 734 connected together as shown in FIG. 7.

More specifically, the differential pair of input transistors 702 and 704 are connected such that their gate terminals serve as a pair of differential inputs receiving input signals IP1 and IM1, respectively. These signals IP1 and IM1 effectively represent or are generated from the two comparator inputs INP and INM to be compared with one another (see e.g., the two inputs to comparator 180 in FIG. 4).

The input transistors 702 and 704 are connected between the common tail node 730 and the output nodes 726 and 728, respectively, but via the cascode transistors 706 and 708, respectively. The transistors 706 and 708 are connected at their gate terminals to a steady, non-clocked (non-switched) or DC bias signal so that they act as cascode transistors. In this case, the transistors 706 and 708 are NMOS transistors and their gate terminals are connected to the first voltage reference source (VDD) 732.

The cross-coupled output transistors 710 and 712 (cross-coupled loads) are respectively connected between the output nodes 726 and 728 and the second reference voltage source 734 (GND). The diode-connected output transistors 714 and 716 (diode-connected loads) similarly are respectively connected between the output nodes 726 and 728 and the second reference voltage source 734 (GND). Thus, the transistors 710 and 714 are connected in parallel with one another, and the transistors 712 and 716 are also connected in parallel with one another.

The current-source transistor 718 is connected between the common tail node 730 and the first reference voltage source 732 (VDD). The current-source transistor 718 is controlled at its gate terminal by a non-clocked, steady or DC bias signal $V_{BIAS}$, and thus acts as a current source supplying a steady or DC bias current $I_{BIAS}$ to flow into the tail node 730. The current-source transistor 718 could be replaced with an IDAC (current DAC) for example, for digital control.

The ground and VDD levels between circuitry 800 and 700 (and, indeed, 600) may be the same but this is not essential.

Transistors 706, 708, 710, 712, 714, 716 and 720 are NMOS MOSFETs and transistors 702, 704 and 718 are PMOS MOSFETs. Of course the FIG. 7 circuitry could be implemented "the other way up", swapping NMOS MOSFETs for PMOS MOSFETS and vice versa. As before, MOSFETs are only one example type of FET (field-effect transistor), and thus these transistors may be described as field-effect transistors since other types of FET could be used.

The transistors 710 and 712 may be considered cross-coupled in that the gate terminal of one is connected to the drain terminal of the other, and vice versa. The transistors 714 and 716 may be considered diode-connected in that, for each of them, their gate and drain terminals are connected together (so that their gate-drain voltage is 0V, and they are always in the saturation region). The general aim is to ensure that current is always flowing through transistors 702 and 704, so that they don't have to turn on, and the diode-connected transistors 714 and 716 assist with this.

The second gain stage 700, like the latch stage 800, is structured in the form of parallel (complementary or differential) current paths, which extend between the first reference voltage source 732 (VDD) and the second reference voltage source 734 (GND). One such current path extends from VDD to GND via transistors 718, 702, 706 and 710 in that order, and the other extends from VDD to GND via transistors 718, 704, 708 and 712 in that order. The two current paths thus may be considered to meet or merge/diverge at the tail node 730 and pass in common through transistor 718.

Transistors 702 and 704 may thus be considered to be provided along those paths at corresponding (schematically the same) positions, as may be transistors 702 and 704, nodes 722 and 724, transistors 706 and 708, nodes 726 and 728, and transistors 710 and 712. The current path which passes through transistor 710 passes through the parallel connection of transistors 710 and 714, such that the total current passing through node 726 on that path is the sum of the currents passing through the channels of transistors 710 and 714. The current path which passes through transistor 712 passes through the parallel connection of transistors 712 and 716, such that the total current passing through node 728 on that path is the sum of the currents passing through the channels of transistors 712 and 716.

The clocked-transistor 720 is connected between the output nodes 726 and 728 and is connected to be controlled at its gate terminal by the clock signal CLKM.

The input transistors 702 and 704 are connected to receive the input signals IP1 and IM1 respectively at their gate terminals, from the first gain stage 600 described later. The output signals IM2 and IP2 are generated at the output nodes 726 and 728, and are supplied (as input signals IM2 and IP2) to the gate terminals of the input transistors 804 and 802 respectively, of the latch stage 800.

In operation, the circuitry 700 operates in a "fully active" manner, in that there are no clocked or switched transistors whose channels from parts of the two current paths. Effectively, there is continuous current flow through transistors 718, 702 and 704. For example, the current-source transistor 718 generates the steady current $I_{BIAS}$ and the diode-connected transistors 714 and 716 serve to draw (effectively DC) bleed currents from the output nodes 726, 728, which have the effect of clamping the voltages at the output nodes 726, 728 within a range (they effectively track the gate-source voltages of the NMOS diode-connected transistors 714, 716) whereby the cross-coupled transistors 710 and 712 are never fully ON or fully OFF. The diode-connected transistors 714, 716 remain conducting so never turn off during operation of the circuitry of FIG. 7.

The input transistors 702 and 704 are connected to receive the input signals IP1 and IM1 respectively at their gate terminals, and this has the effect of changing the conductivity of the two current paths—based on the difference between the signals IP1 and IM1—such that the steady current $I_{BIAS}$ divides at the tail node 730 unevenly (reflecting that difference). The cross-coupled transistors 710, 712 amplify this imbalance by way of the voltages (signals IM2 and IP2) at the output nodes 726, 728, but within a defined range as mentioned above. Effectively, the output swing (of signals IM2 and IP2) is constrained by the diode-connected transistors 714, 716.

The clocked transistor 720 is controlled by the clock signal CLKM and serves to equalise the voltage at the output nodes 726 and 728 (i.e. the signals IM2 and IP2) during the reset phases, as can be seen in FIG. 8, bringing the signals IM2 and IP2 to the same voltages as one another.

Because the circuitry 700 operates in a "fully active" manner, its transistors (especially 702, 704, 710, 712, 714, 716) are effectively always active and it is very quick to respond to and amplify the difference between the signals IP1 and IM1 by way of the voltages (signals IM2 and IP2) at the output nodes 726, 728 during the regeneration phases when the clock signal CLKM goes low (CLKP goes high). This is in contrast for example to the circuitry 400 of FIG. 6, where the transistors 412, 414 and 416 are at times turned fully OFF by the clock signal.

The hot-wired cascode transistors 706 and 708 reduce kickback (suffered on the input signals IP1 and IM1, and ultimately the input signals INP and INM) by more than 50%.

The second gain stage 700 has high gain, and thus there is the risk of poor amplifier overdrive recovery (when the amplifier goes from having a full-scale signal between its inputs in one polarity to the smallest signal in the system i.e. LSB in the opposite polarity as compared to the previous decision). The differential reset switch (clocked transistor 720) is able to improve the overdrive recovery situation by bringing the output nodes 726 and 728 to the same voltage level in the reset phases. To avoid detrimentally affecting the gain of the second gain stage 700, due to the gate-drain and gate-source parasitic capacitances of the differential reset switch (clocked transistor 720), that differential reset switch should be sized appropriately. For example, if the clocked transistor 720 were sized to be too large the output signals IP2 and IM2 may not have enough time to reset and reproduce the true gain of the amplifier (second gain stage 700, or the combination of the first and second gain stages 600 and 700).

Of course, the addition of the differential reset switch (clocked transistor 720) adds noise as well as clock feed through/injection directly onto the front-end of the amplifier (to the input signals IP1 and IM1, and ultimately to the input signals INP and INM). Strategic placement of the differential reset switch (clocked transistor 720) between the cascode transistors 706 and 708 and the parallel connection of the cross-coupled loads (transistors 710, 712) and diode-connected loads (transistors 714, 716) reduces the latter effects.

However, in applications where input-referred noise requirements are relaxed as well as the accuracy of signals to be resolved (in a SAR ADC, the LSB size), the second gain stage 700 could be provided without the cascode transistors 706 and 708 (i.e. connecting nodes 706 and 726 together, and nodes 708 and 728 together) and without the clocked transistor 720 (differential reset switch), but still connected at nodes 726 and 728 to the latch stage 800 as in FIG. 7.

The gain $A_{700}$ of the second gain stage 700 could be expressed as:

$$A_{700} = \frac{g_{704}}{g_{716} - g_{712}}$$

where $g_{704}$ is the transconductance ($g_m$) of the transistor 704, $g_{716}$ is the transconductance ($g_m$) of the transistor 716, and $g_{712}$ is the transconductance ($g_m$) of the transistor 712. It will be appreciated from this equation that with good matching between the transistors 712 and 716 the gain could be very high (potentially infinite, but in practice simply very high).

It is important to note that, unlike in FIGS. 5 and 6 where the input differential transistors 302, 304 are driven in voltage mode (from the nodes 408, 410) and there is a clocked current source (transistor 330) connected between the source terminals of the differential pair 302, 304 and GND, in FIG. 7 the gate terminals of the diode-connected transistors 714, 716 are connected to the gate terminals of the input transistors 804, 802, respectively, the source terminals of all of those transistors are connected (directly) to GND, and those transistors are configured to operate in saturation mode. Thus, current-mirror arrangements are formed by the transistor pair 714 and 804 and by the transistor pair 716 and 802, so that the latch stage 800 (regenerative latch) is driven by the second gain stage 700 in current mode, with the diode-connected loads (transistors 714 and 716) of the second gain stage 700 serving as reference current sources. That is, the currents flowing through the diode-connected transistors 714, 716 are mirrored to form the currents flowing through the input transistors 804, 802, respectively.

This has the inherent benefit of low noise, high speed and enhanced dynamic range. The dynamic range is extended as compared to the FIG. 5 voltage mode regenerative latch whose Input Common Mode Range is limited by the Vgs of the input pair 302, 304 and the Vdsat of clocked current source 330.

For example, the voltage swing at the gates of transistors 802 and 804 in the latch stage 800 of FIG. 7 can be larger than for transistors 302 and 304 given the absence of a clocked transistor corresponding to transistor 330 of FIG. 5. Further, since the latch stage 800 takes the current from the second gain stage 700 (i.e. the preamplifier) as a reference current and mirrors it through or into the latch stage 800, the effect of the Miller capacitances (effectively the gate-drain capacitance) associated with the transistors 802 and 804 is reduced or eliminated. For example, the distributed gain across the stages 600, 700 800 of the FIG. 7 circuitry 500 reduces the effect of the Miller capacitances associated with the transistors 802 and 804 as seen at the inputs (gates of transistors 602, 604) of the overall circuitry 500. Also, due to the distributed gain, the gain seen from gate to drain of the transistors 802 and 804 is designed to be smaller (than it may need to be without such distributed gain) and therefore the input capacitance due to Miller effect is much reduced.

The current-mode approach may be referred to as a "pseudo" current-mode approach (the latch stage 800 driven by the second gain stage 700 could be referred to as a Pseudo Current-Mode Latch) as the mirroring ratio does not need to be exactly 1:1, but can be selected to be greater than 1 and is dependent on the Vgs of the devices (transistors) 306 and 308. The mirroring approach also realises the true gain of the second gain stage 700 as it does not "rob" the second gain stage 700 of small signal current during the amplification phase.

The first gain stage 600 comprises a differential pair of input transistors 602 and 604, a pair of resistors (load resistors, resistances, or resistive loads) 606 and 608, a pair of output nodes 610 and 612, a current-source transistor 618, a tail node 630, a first reference voltage source (VDD) 632 and a second reference voltage source (GND) 634 connected together as shown in FIG. 7.

Figure 4:
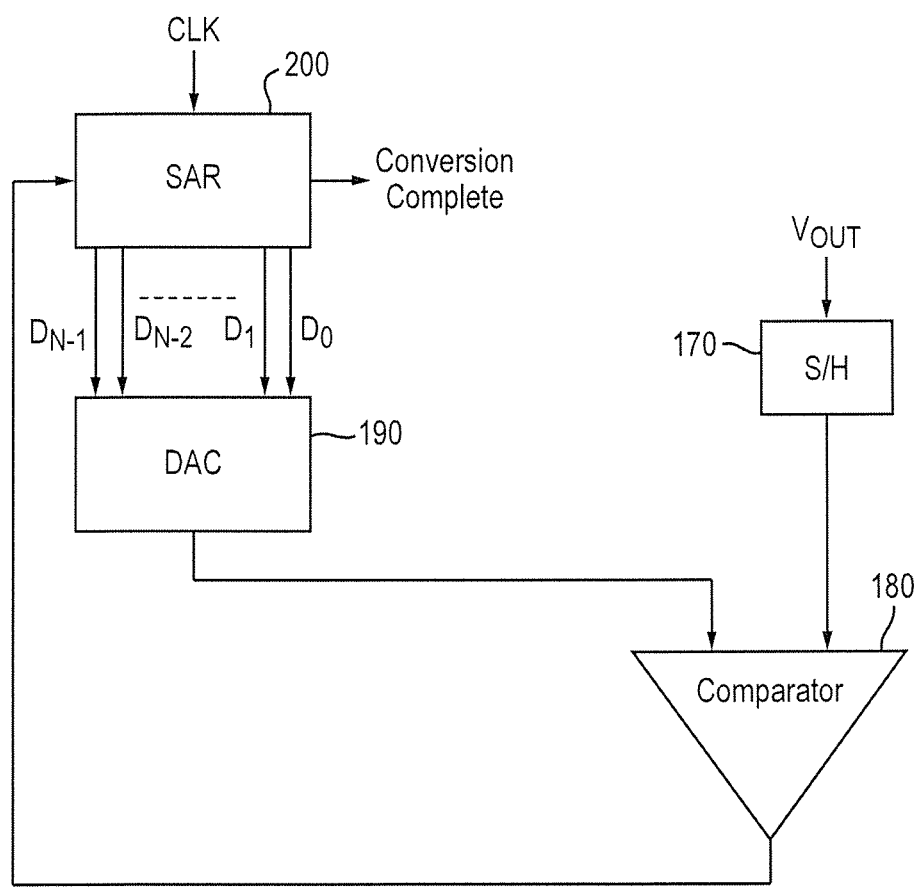

More specifically, the differential pair of input transistors 602 and 604 are connected such that their gate terminals serve as a pair of differential inputs receiving the two comparator input signals INP and INM to be compared with one another (see e.g., the two inputs to comparator 180 in FIG. 4).

The input transistors 602 and 604 are connected between the common tail node 630 and the output nodes 610 and 612, respectively. The resistors 606 and 608 are connected respectively between the output nodes 610 and 612 and the second reference voltage source (GND) 634.

The current-source transistor 618 is connected between the common tail node 630 and the first reference voltage source 632 (VDD). The current-source transistor 618 is controlled at its gate terminal by a non-clocked, steady or DC bias signal $V_{BIAS}$, as thus acts as a current source supplying a steady or DC bias current $I_{BIAS}$ to flow into the tail node 730. The current-source transistor 618 could be replaced with an IDAC (current DAC), again for digital control.

The bias signal $V_{BIAS}$ and bias current $I_{BIAS}$ of the first gain stage 600 may be the same as for the second gain stage 700, but need not be. Similarly, the GND and VDD voltage levels between circuitry 600 and 700 may be the same but this is not essential. Transistors 602, 604 and 618 are PMOS MOSFETs. As before, MOSFETs are only one example type of FET (field-effect transistor), and thus these transistors may be described as field-effect transistors. Also the circuitry could be provided 'the other way up', swapping N-channel devices for P-channel devices, and vice versa.

It will be appreciated that the first gain stage 600 (like the second gain stage 700 and the latch stage 800) is structured in the form of parallel (complementary or differential) current paths, which extend between the first reference voltage source 632 (VDD) and the second reference voltage source 634 (GND). One such current path extends from VDD to GND via transistors 618 and 602 and the resistor 606 in that order, and the other extends from VDD to GND via transistors 618 and 604 and the resistor 608 in that order. The two current paths thus may be considered to meet or merge/diverge at the tail node 630 and pass in common through transistor 618. Transistors 602 and 604 may thus be considered to be provided along those paths at corresponding (schematically the same) positions, as may be nodes 610 and 612, and resistors 606 and 608.

The input transistors 602 and 604 are connected to receive the input signals INP and INM respectively at their gate terminals, as the two comparator input signals to be compared with one another. The output signals IM1 and IP1 are generated at the output nodes 610 and 612, and are supplied (as input signals IM1 and IP1) to the gate terminals of the input transistors 704 and 702, respectively, of the second gain stage 700.

In operation, the circuitry 600 (like the circuitry 700) operates in a "fully active" manner, in that there are no clocked or switched transistors whose channels from parts of the two current paths. For example, the current-source transistor 618 generates its steady current Ieas, and the resistors are (or act as, if implemented as transistors) passive components. The input transistors 602 and 604 are connected to receive the input signals INP and INM respectively at their gate terminals, and this has the effect of changing the conductivity of the two current paths—based on the difference between the signals INP and INM—such that the steady current $I_{BIAS}$ divides at the tail node 630 unevenly (reflecting that difference).

The first gain stage 600 thus essentially comprises a resistively loaded (resistors 606 and 608) differential pair (transistors 602 and 604). The function of this stage is mainly to reduce the kickback noise (experienced as noise on the input signals INP and INM), rather than dealing with kickback noise by using source followers which have a low output impedance looking back from the source follower from the second stage and high input impedance looking into the input of the comparator. The latter mechanism is what provides isolation of the comparator from the circuit it is interfaced to (in the case of a SAR ADC, the DAC corresponding to DAC 190 in FIG. 4 which could be a CDAC.

For example, kickback could be either common mode or differential. Common mode could feed back into the source impedance (or capacitance in a sampling circuit upstream of the comparator circuitry) and upset the input to the comparator circuitry. Differential could move INP and INM apart or closer together and cause the comparator circuitry to make a false decision. Both differential and common mode kickbacks may cause problems with charge being injected into a CDAC.

Using the source follower as mentioned above may be considered inefficient as its output impedance is not defined and is a function of time depending on the kickback and previous decision of the regenerative latch. It also may be considered inefficient in terms of power due to the fact that both differential inputs INP and INM (at transistors 602 and 604) require separate current sources to implement a source follower solution.

Instead, the first gain stage 600 architecture uses a resistively loaded differential pair (transistors 602 and 604) with a single current source (transistor 618) which leads to half the current consumption in comparison to the source follower solution. Another inherent benefit of the resistively loaded differential pair is that it provides gain in comparison to the source follower (which has a gain slightly<1).

The gain $A_{600}$ of the first gain stage 600 may be defined by:

$$A_{600}=g_{602} \times R_{606}$$

where $g_{602}$ is the transconductance ($g_m$) of the transistor 602 and $R_{606}$ is the resistance of the resistor 606.

Since this stage has the inherent benefit of having gain, the overall pre-amplifier gain required for the comparator circuitry 500 can be split amongst the two distinct preamplifier stages (i.e. the first gain stage 600 and the second gain stage 700) which enables reducing the overall kickback which couples back to the input of the comparator whilst keeping the same input-referred noise. Having some gain (~33-35% of the required overall gain) in first gain stage 600 also relaxes the effect of the Miller capacitance that appears at the input transistors 702, 704 of the second gain stage 700 enabling optimisation of gain, power and speed. As before, the effect of a Miller capacitance seen at the input of a stage is reduced by distributing gain across multiple stages.

Because the circuitry 600 operates in a "fully active" manner, its transistors (especially 602, 604) are effectively always active and it is very quick to respond to and amplify the difference between the signals INP and INM by way of the voltages (signals IM1 and IP1) at the output nodes 610, 612. The use of the resistors 606, 608 enables the voltages at nodes 610, 612 to be biased so that small glitches at those nodes do not affect the operating point of transistors 602, 604 which remain in saturation mode, improving the linearity of the first gain stage 600.

It will be appreciated that the comparator circuitry 500 is shown for P channel inputs however it would of course be possible to implement equivalent circuitry with N channel inputs, with three distinct stages corresponding to stages 600, 700 and 800.

In summary, the comparator circuitry 500 of FIG. 7 addresses problems with previously-considered comparator circuitry. Such problems include: high area of the dynamic comparator needed when high gain is required to have low input-referred noise; high input-referred noise; kickback noise onto the comparator inputs; clock feed through; high input offsets; high input parasitic capacitance; low speed; and metastability. The comparator circuitry 500 of FIG. 7 addresses these problems by way of its two distinct preamplifier stages (the first gain stage 600 and the second gain stage 700) along with its current-mode latch (the latch stage 800).

The first gain stage 600 comprises a resistively loaded active differential pair (transistors 602, 604) which provides consistent gain across process variation and reduces the kickback noise by providing a low output impedance looking back from the input of the second gain stage 700 and high input impedance looking into the input of the comparator circuitry 500 (i.e. at transistors 602, 604).

The second gain stage 700 comprises a differential pair (transistors 702, 704) loaded with a cross-coupled load (transistors 710, 712) accompanied with diode-connected loads (transistors 714, 716) which define the common-mode of the output of the preamplifier. Addition of cascodes (transistors 706, 708) between the differential pair (transistors 702, 704) and cross-coupled loads (transistors 710, 712) reduces kickback. The addition of a differential reset switch (transistor 720) eliminates the problem of overdrive recovery, however it also introduces clock feed through as well as noise at the front end of the amplifier. Therefore, the differential reset switch (transistor 720) is placed below the cascodes (in between the cross-coupled load and the cascodes). Given the gain of the first gain stage 600, the differential pair (transistors 702, 704) of the second gain stage 700 can be smaller—any offset referred to the comparator circuitry input (transistors 602, 604) is divided by the gain of the first gain stage 600.

The latch stage 800 is driven current mode as it takes the current from the second gain stage 700 preamplifier and mirrors it through the latch hence eliminating the Miller capacitance seen in previously-considered regenerative latches. Such previously-considered regenerative latches usually are driven in voltage mode and have a clocked current source, which leads to slow operation as a relatively large Miller capacitance is seen at the input of the latch and also leads to asymmetric kickback as well as clock feed through as it is dependent on the mismatch of the input pair of the regenerative latch. The mirroring approach in respect of the latch stage 800 also realises the true gain of the second gain stage 700 as it does not "rob" the second gain stage 700 of small signal current during the amplification phase.

Accordingly, the comparator circuitry 500 of FIG. 7 enjoys low input-referred noise. The main source of noise is due to the regenerative latch stage 800 making large excursions to or towards the supply rails during comparison (regeneration) phases, i.e. the voltages at the output nodes 314, 316 being pulled respectively towards the voltage levels at the voltage sources 322, 332 and then potentially the other way. This can corrupt the input (i.e. the overall input signals INP, INM) and make the comparator make a wrong decision during comparison (regeneration) phases. Since the noise is input-referred it can be minimized by having multiple gain stages (here, the first and second gain stages 600, 700) prior to the latch stage 800, which attenuate the noise of the latch stage 800 while being referred to the input of the comparator.

The comparator circuitry 500 of FIG. 7 also enjoys reduced kickback noise, which affects settling time. Kickback noise inherently gets reduced by adding the active preamplifier gain stages 600, 700. The input pair 802, 804 of the regenerative latch stage 800 is the main source of the kickback which is generated during the reset phases of the latch stage 800. During the reset phases of the comparator only one input has to go from logic 0 to 1 or vice-versa depending on the reset assertion level. This induces an asymmetric kickback, however having multiple preamplifier stages as in the comparator circuitry 500 as well as the cascodes as already mentioned help in reducing the coupling back to the input at transistors 602, 604.

The comparator circuitry 500 of FIG. 7 also substantially reduces or eliminates clock feed through, as there is no current source (equivalent to transistor 330) at the bottom of the latch stage 800.

The comparator circuitry 500 of FIG. 7 also enjoys low input offset. The main source of offsets comes from the latch stage 800 (e.g. mismatch between the input transistors 802, 804) and becomes even more sensitive depending on input signal levels coming into the input transistors 602, 604 of the comparator. The addition of the preamplifier gain stages 600, 700 reduces the offset—i.e. the offset referred to the input 602, 604 is divided by the gain of the gain stages 600, 700. For similar reasons, it is possible to enjoy low input parasitic capacitance. By sizing and staggering/distributing the total amount of gain in the different stages 600, 700, 800, the parasitic input capacitance to the input 602, 604 of the comparator can be reduced as it alleviates the need for big input transistor pairs required to achieve the overall gain. Also, the input transistor pairs 702, 704 and 802, 804 can be reduced in size (reducing parasitic capacitance and increasing speed) as associated offsets/mismatch as referred to the comparator input at transistors 602, 604 is divided by the gains of the preceding gain stage or stages 600, 700 as appropriate. In summary, mismatch is present in all stages but adding gain stages reduces the effect of the mismatch in later stages. Transistors 802 and 804, for example, can therefore be smaller for the same input referred offset and hence the circuit can operate faster.

The comparator circuitry 500 of FIG. 7 is relatively high-speed circuitry due to its fully-active nature (as described above in connection with the gain stages 600, 700), taking into account also the current-mode approach in respect of the latch stage 800 with the absence of a current source equivalent to transistor 330. The present inventor has found the comparator circuitry 500 of FIG. 7 to be 3 to 4 times faster than previously-considered comparator circuitry (for example, as in FIGS. 5 and 6) whilst keeping the same input resolution (i.e. LSB step size).

The comparator circuitry 500 of FIG. 7 also enjoys reduced metastability. Metastability is reduced as the input signal going into the regenerative latch stage 800 is amplified by the preamplifier stages 600, 700 and makes the rate of change of current in the latch stage 800 much larger which in turn makes the latch stage 800 make a decision much quicker compared to other dynamic latches. By making a decision much quicker the probability of a metastable state occurring reduces.

The comparator circuitry 500 of FIG. 7 is also efficient in terms of integrated circuitry area, as evident from the circuitry of FIG. 7.

The disclosed comparator circuitry is for use in a comparator to capture differences between magnitudes of a pair of comparator input signals in a series of capture operations defined by a reset signal, the circuitry comprising: latch circuitry, comprising a pair of latch input transistors which form corresponding parts of first and second current paths of the latch circuitry respectively, which current paths extend in parallel between high and low voltage sources, a pair of latch output nodes at corresponding positions along the first and second current paths of the latch circuitry respectively, and timing circuitry; and gain-stage circuitry, comprising a pair of cross-coupled gain-stage output transistors connected along respective first and second current paths of the gain-stage circuitry which extend in parallel between high and low voltage sources, and a pair of diode-connected gain-stage output transistors connected in parallel with the pair of cross-coupled gain-stage output transistors, respectively.

Figure 1:
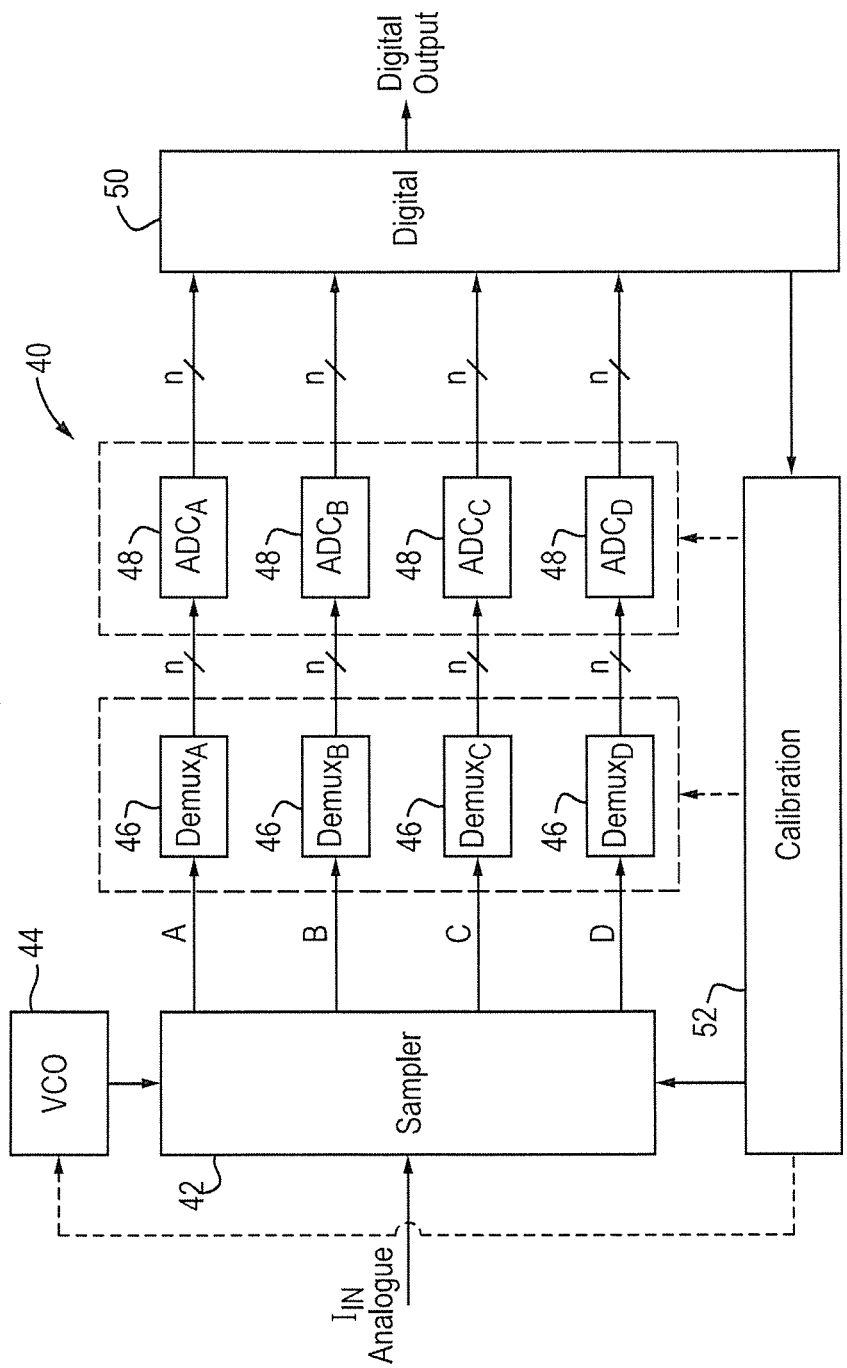
Figure 2:
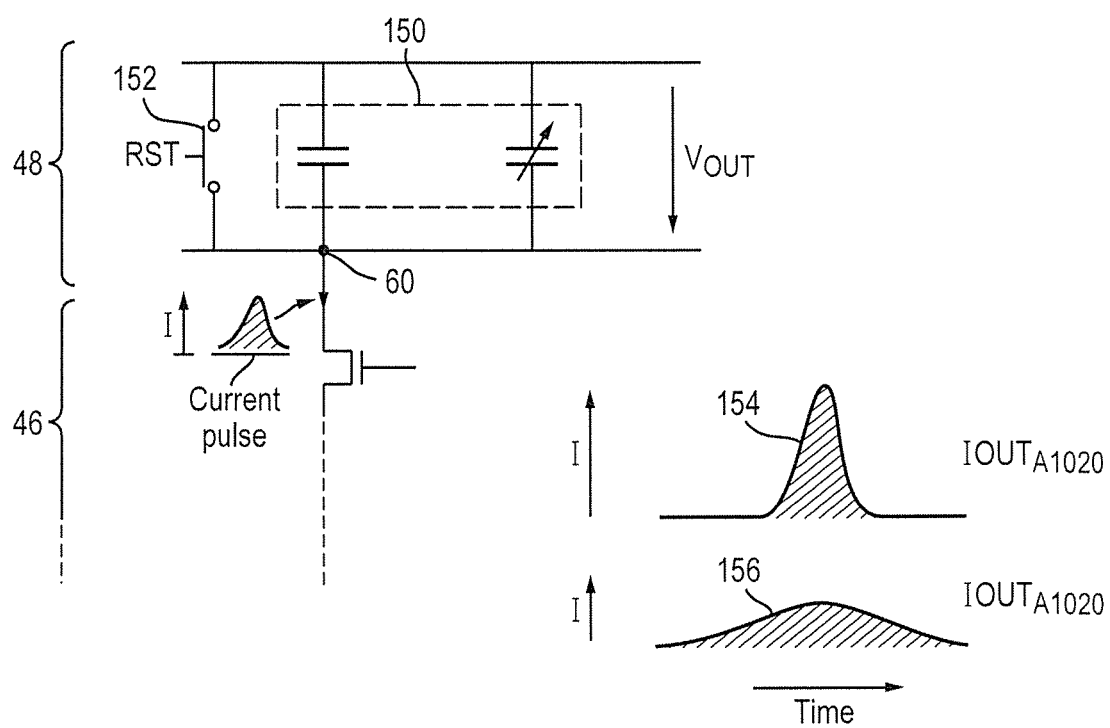
Figure 3:
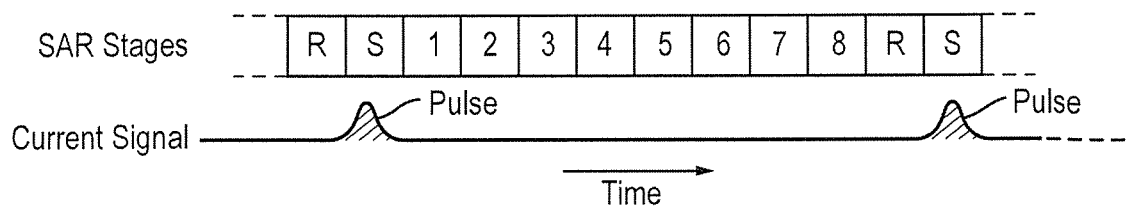
Figure 9:
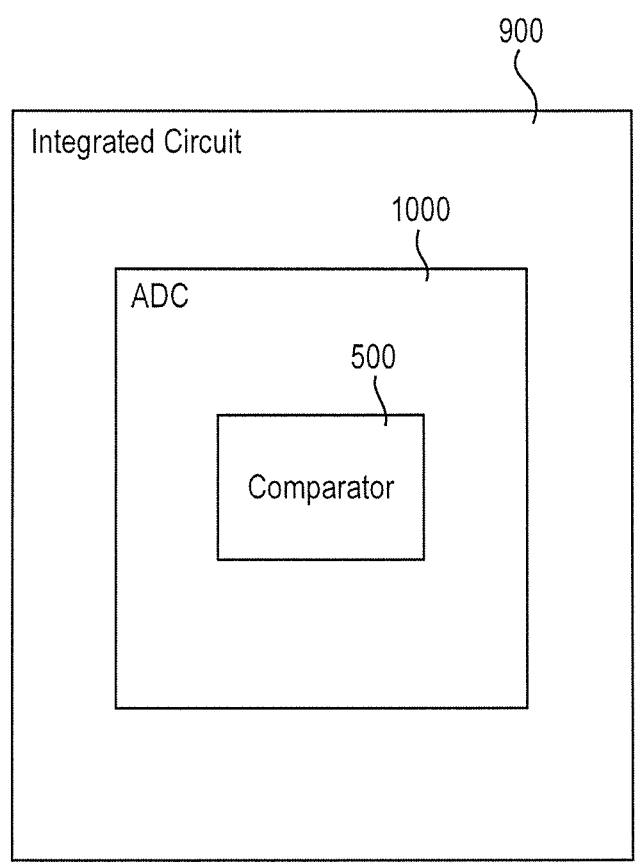
FIG. 9 is a schematic diagram of an integrated circuit embodying the present invention.

FIG. 9 is a schematic diagram of an integrated circuit 900 embodying the present invention. The integrated circuit 900 comprises ADC circuitry 1000, which itself comprises the comparator or comparator circuitry 500. For example, the ADC circuitry 1000 may correspond to the circuitry 40 or 48 of FIG. 1, where the comparator provided in the circuitry 48 (corresponding to the comparator 180 of FIG. 4) is implemented as the comparator or comparator circuitry 500.

It will be appreciated therefore that the circuitry 500 disclosed herein could be provided as part of an ADC, which ADC itself embodies the present invention. Circuitry of the present invention may be implemented as integrated circuitry, for example on an IC chip such as a flip chip. Thus, the integrated circuit 900 may be an IC chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

In general, transistors disclosed herein may be implemented as MOSFETs or FETs (as shown) or as BJTs. The present disclosure will be understood accordingly.

The present invention may be embodied in many different ways in the light of the above disclosure, within the spirit and scope of the appended claims.

The invention claimed is:

1. Comparator circuitry for use in a comparator to capture differences between magnitudes of a pair of comparator input signals in a series of capture operations defined by a reset signal, the circuitry comprising:
   latch circuitry, comprising a pair of latch input transistors which form corresponding parts of first and second current paths of the latch circuitry respectively, the first and second current paths extending in parallel between high and low voltage sources, a pair of latch output nodes at corresponding positions along the first and second current paths of the latch circuitry respectively, and timing circuitry; and
   gain-stage circuitry, comprising a pair of cross-coupled gain-stage output transistors connected along respective first and second current paths of the gain-stage circuitry which extend in parallel between high and low voltage sources, and a pair of diode-connected gain-stage output transistors connected in parallel with the pair of cross-coupled gain-stage output transistors, respectively,
   wherein:
   the timing circuitry is configured to bring voltage levels at said latch output nodes to a reset state between successive capture operations based on the reset signal to control the timing of the series of capture operations;
   the gain-stage circuitry is configured, in the capture operations, to control currents flowing through the pairs of cross-coupled gain-stage output transistors based on the pair of comparator input signals whereby a difference between currents flowing through the pair of diode-connected gain-stage output transistors is dependent upon a difference between the pair of comparator input signals;
   the pair of diode-connected gain-stage output transistors are connected to the pair of latch input transistors respectively in respective current-mirror arrangements whereby currents flowing through the latch input transistors in the capture operations are related to the currents flowing through the diode-connected gain-stage output transistors respectively due to current mirroring; and
   the latch circuitry is configured, in the capture operations, to generate a latch output signal at the latch output nodes indicative of a difference between the comparator input signals based on a difference between the currents flowing through the latch input transistors.

2. The comparator circuitry as claimed in claim 1, wherein:
   the latch circuitry comprises a pair of cross-coupled latch output transistors which form parts of the first and second current paths of the latch circuitry respectively between the latch output nodes and one of the high and low voltage sources, the pair of latch input transistors forming parts of the first and second current paths of the latch circuitry respectively between the latch output nodes and the other one of the high and low voltage sources.

3. The comparator circuitry as claimed in claim 2, wherein:
   the latch circuitry comprises a pair of intermediate nodes at corresponding positions between the latch output nodes and the latch input transistors along the first and second current paths of the latch circuitry respectively; and
   the pair of cross-coupled latch output transistors is a first pair of cross-coupled latch output transistors; and
   the latch circuitry comprises a second pair of cross-coupled latch output transistors which form parts of the first and second current paths of the latch circuitry respectively between the latch output nodes and the intermediate nodes.

4. The comparator circuitry as claimed in claim 3, wherein:
   the first pair of cross-coupled latch output transistors are of opposite channel type to the second pair of cross-coupled latch output transistors; and
   for each of the first and second current paths of the latch circuitry, the drain terminals of the cross-coupled latch output transistors concerned are connected together at the latch output node of that current path.

5. The comparator circuitry as claimed in claim 3, wherein:
   the drain terminals of the latch input transistors form the intermediate nodes of the latch circuitry.

6. The comparator circuitry as claimed in claim 1, wherein:
   the source terminals of the latch input transistors form ends of their respective current paths at one of the high and low voltage sources concerned, or are connected to the one of the high and low voltage sources concerned via non-switched current paths.

7. The comparator circuitry as claimed in claim 1, wherein:
   the timing circuitry comprises at least one switch configured to conductively connect the latch output nodes to one another and/or to a common voltage source based on the reset signal to bring voltage levels at said latch output nodes to the reset state between successive capture operations.

8. The comparator circuitry as claimed in claim 1, wherein the source terminals of the cross-coupled gain-stage output transistors, and/or of the diode-connected gain-stage output transistors, form ends of their respective current paths at one of the high and low voltage sources concerned, or are connected to the one of the high and low voltage sources concerned via non-switched current paths.

9. The comparator circuitry as claimed in claimed in claim 1, wherein the gain-stage circuitry comprises:
- a current source configured to provide a bias current which flows independently of the reset signal;
- a tail node at which the first and second current paths of the gain-stage circuitry meet to form a single current path along which the current source is provided, the tail node connected to receive the bias current;
- a pair of intermediate nodes conductively connectable to said tail node along the first and second current paths of the gain-stage circuitry respectively, those intermediate nodes located along the first and second paths of the gain-stage circuitry between the cross-coupled gain-stage output transistors and the tail node; and
- a pair of gain-stage input transistors connected along the first and second current paths of the gain-stage circuitry respectively, between the intermediate nodes of the gain-stage circuitry and the tail node, and configured to be controlled based on the pair of comparator input signals, respectively, such that the conductivity of the connections between the tail node and the pair of intermediate nodes is controlled by the magnitudes of the pair of comparator input signals,
- optionally wherein the bias current is a non-switched, constant or DC bias current.

10. The comparator circuitry as claimed in claim 9, wherein the gain-stage circuitry comprises:
- a pair of intermediate transistors connected along the first and second current paths of the gain-stage circuitry respectively, between the intermediate nodes of the gain-stage circuitry and the cross-coupled gain-stage output transistors,
- optionally wherein the intermediate transistors are controlled by a bias signal which is independent of the reset signal, and optionally wherein:
- the bias signal is a non-switched, constant or DC bias signal; and/or
- the bias signal is configured to cause the intermediate transistors to function as cascode transistors.

11. The comparator circuitry as claimed in claimed in claim 1, wherein:
- the drain terminals of the cross-coupled gain-stage output transistors form output nodes of the gain-stage circuitry and are connected to control the latch input transistors respectively.

12. The comparator circuitry as claimed in claim 1, wherein:
- the gain-stage circuitry comprises timing circuitry configured to bring voltage levels at the drain terminals of the cross-coupled gain-stage output transistors to a reset state between successive capture operations based on the reset signal;
- optionally wherein that timing circuitry comprises at least one switch configured to conductively connect the drain terminals of the cross-coupled gain-stage output transistors to one another based on the reset signal.

13. The comparator circuitry as claimed in claim 1, wherein:
- said gain-stage circuitry is second-gain-stage circuitry and the comparator circuitry comprises first-gain-stage circuitry; and
- the first-gain-stage circuitry comprises:
- first and second current paths which extend in parallel between the high and low voltage sources;
- a current source configured to provide a bias current which flows independently of the reset signal;
- a tail node at which the first and second current paths of the first-gain-stage circuitry meet to form a single current path along which the current source of the first-gain-stage circuitry is provided, the tail node connected to receive the bias current;
- a pair of intermediate nodes conductively connectable to the tail node of the first-gain-stage circuitry along the first and second current paths of the first-gain-stage circuitry respectively, the pair of intermediate nodes located along the first and second current paths of the first-gain-stage circuitry between a pair of resistive loads located at corresponding positions along the first and second current paths and the tail node; and
- a pair of input transistors connected along the first and second current paths of the first-gain-stage circuitry respectively, between the intermediate nodes and the tail node of the first-gain-stage circuitry, and configured to be controlled by the pair of comparator input signals, respectively, such that the conductivity of the connections between the tail node and the pair of intermediate nodes of the first-gain-stage circuitry is controlled by the magnitudes of the pair of comparator input signals,
- wherein drain terminals of the input transistors of the first-gain-stage circuitry form output nodes of the first-gain-stage circuitry which are connected to a pair of input transistors of the second-gain-stage circuitry respectively to control those input transistors of the second-gain-stage circuitry respectively.

14. Analogue-to-digital converter circuitry, comprising the comparator circuitry as claimed in claim 1.

15. Integrated circuitry, such as an IC chip, comprising the comparator circuitry as claimed in claim 1.

16. Integrated circuitry, such as an IC chip, comprising the analogue-to-digital converter circuitry as claimed in claim 14.

* * * * *